United States Patent
Lin

(10) Patent No.: US 8,174,417 B2
(45) Date of Patent: May 8, 2012

(54) SYSTEM AND A METHOD OF CORRECTING BASELINE WANDER

(75) Inventor: Chih-Feng Lin, Tainan County (TW)

(73) Assignee: Himax Media Solutions, Inc., Tainan County (TW)

( * ) Notice: Subject to any disclaimer, the term of this patent is extended or adjusted under 35 U.S.C. 154(b) by 50 days.

(21) Appl. No.: 12/901,318

(22) Filed: Oct. 8, 2010

(65) Prior Publication Data

US 2012/0086588 A1    Apr. 12, 2012

(51) Int. Cl.
*H03M 1/06* (2006.01)
(52) U.S. Cl. .................................... 341/118; 341/155
(58) Field of Classification Search .................. 341/118, 341/155, 120, 156; 375/219, 229, 344
See application file for complete search history.

(56) References Cited

U.S. PATENT DOCUMENTS

| | | | | |
|---|---|---|---|---|
| 5,926,123 A * | 7/1999 | Ostrom et al. | ................. | 341/120 |
| 7,102,559 B2 * | 9/2006 | Van Tuijl | ....................... | 341/156 |
| 7,176,819 B1 * | 2/2007 | Swerlein et al. | ............... | 341/143 |
| 7,746,969 B2 * | 6/2010 | Bryan et al. | .................... | 375/349 |
| 7,932,847 B1 * | 4/2011 | Hsieh et al. | .................... | 341/155 |

\* cited by examiner

*Primary Examiner* — Brian Young
(74) *Attorney, Agent, or Firm* — Stout, Uxa, Buyan & Mullins, LLP

(57) ABSTRACT

A system and method of correcting baseline wander (BLW) are disclosed. An analog-to-digital converter (ADC) converts an analog input to a digital output, and a slicer maps the digital output to one of a plurality of predefined values. A BLW correction unit generates a BLW correction value according to a difference between an input and an output of the slicer. A correction controller generates a fine correction value and a coarse correction value according to the BLW correction value. Specifically, the fine correction value is used to correct the digital output of the ADC, and the coarse correction value is used to correct the analog input of the ADC.

15 Claims, 6 Drawing Sheets

BLW correction value | 1 | 2 | OFFS | 5 | 6 | 7 | 8 |

Fine correction value | DOF | 5 | 6 | 7 | 8 |

Coarse correction value | 1 | 2 | AOF |

FIG. 2

SYSTEM AND A METHOD OF CORRECTING BASELINE WANDER

BACKGROUND OF THE INVENTION

1. Field of the Invention

The present invention generally relates to baseline wander (BLW) correction, and more particularly to a system and method of correcting BLW for a communication receiver.

2. Description of Related Art

Ethernet is a computer networking that is widely used in constructing a local area network. Fast Ethernet or 100BASE-TX, for example, transfers data at a nominal rate of 100 Mbit/sec. At the transmitting side, data is transferred through a transformer before it is transmitted. At the receiving side, data is transferred through another transformer before it is received by a receiver. The transformer, however, functions as a high-pass filter that decays or blocks DC component of a transferred signal, resulting in baseline wander (BLW) effect. Specifically, the baseline of signal waveform at the receiving side is suffered by the baseline wander effect, particularly when a long string of positive or negative packets is transferred.

A variety of techniques have been disclosed to overcome the baseline wander effect. One of them uses an analog-to-digital converter (ADC) to convert a received analog signal into a digital form. A baseline wander correction scheme is then applied to correct the received signal both in analog domain and digital domain at the same time. However, due to latency existed in the ADC, particularly a pipelined ADC, a delay line or circuit is thus required to hold the analog signal, therefore making the entire circuit area bulky and consuming more power.

For the reason that the conventional BLW correction system could not perform BLW correction in a cost-effective manner, a need has arisen to propose a novel BLW correction scheme to reduce its chip area and consumed power.

SUMMARY OF THE INVENTION

In view of the foregoing, it is an object of the embodiment of the present invention to provide a baseline wander (BLW) correction system and method that have simplified architecture, have reduced chip area, and consume less power.

According to one embodiment, the BLW correction system includes at least an analog-to-digital converter (ADC), a slicer, a BLW correction unit and a correction controller. The ADC converts an analog input to a digital output. The slicer maps the digital output to one of a plurality of predefined values. The BLW correction unit generates a BLW correction value according to a difference between an input and an output of the slicer. The correction controller generates a fine correction value and a coarse correction value according to the BLW correction value. Specifically the fine correction value is used to correct the digital output of the ADC, and the coarse correction value is used to correct the analog input of the ADC.

BRIEF DESCRIPTION OF THE DRAWINGS

FIG. 2 exemplifies a BLW correction value, a fine correction value, and a coarse correction value;

DETAILED DESCRIPTION OF THE INVENTION

Figure 1:
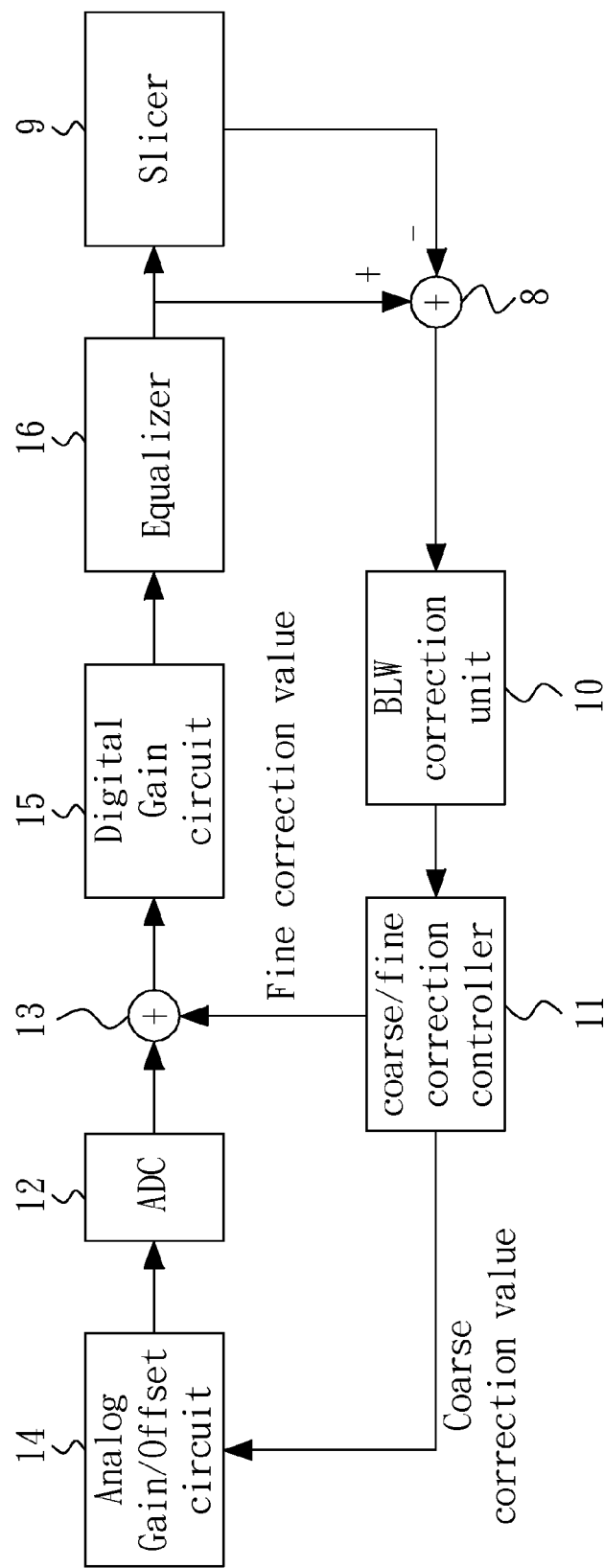
FIG. 1 shows a block diagram of a system of correcting baseline wander (BLW) for a communication receiver according to one embodiment of the present invention.

FIG. 1 shows a block diagram of a system of correcting baseline wander (BLW) for a communication receiver according to one embodiment of the present invention. The BLW correction system may, for example, be adapted to an Ethernet receiver.

In the embodiment, a baseline wander (BLW) correction unit 10 generates a BLW correction value according to a difference between an input to a slicer 9 and an output of the slicer 9, for example, by an adder 8. The BLW correction unit 10 may be implemented by a conventional technique such as a low pass filter. Generally speaking, the slicer is a device that maps an input to one of a number of predefined values.

According to one aspect of the present embodiment, a coarse/fine correction controller 11 receives the BLW correction value from the BLW correction unit 10. Based on the BLW correction value, the coarse/fine correction controller 11 generates a fine correction value composed of a number of least significant bits (LSBs) of the BLW correction value, and a coarse correction value which consists of a number of most significant bits (MSBs) of the BLW correction value. There is a bit-wide overlap (or swap) region between the fine correction value and the coarse correction value. The width of the swap region may be, for example, two-bit wide. FIG. 2 exemplifies a BLW correction value, a fine correction value, and a coarse correction value. In the figure, numeral "1" represents bit $2^{-1}$, numeral "2" represents bit $2^{-2}$, etc. The fine swap region in the fine correction value is denoted DOF, and the coarse swap region in the coarse correction value is denoted AOF.

The fine correction value is used to correct a digital output of an analog-to-digital converter (ADC) 12, for example, via an adder 13 that is disposed after the ADC 12. On the other hand, the coarse correction value is used to correct an analog input to the ADC 12, for example, via an analog gain/offset circuit 14 that is disposed before the ADC 12.

Conceptually speaking, at the beginning, the fine correction value with zero-value DOF is used to perform fine correction in a digital way, while the coarse correction value is zero. Whenever the fine swap region DOF becomes non-zero (e.g., 01), this non-zero DOF is duplicated to the coarse swap region AOF, which is used to perform coarse correction in an analog way. As latency commonly exists in the ADC 12, particularly a pipeline-based ADC, this non-zero AOF does not take effect on the BLW correction system until the latency has elapsed. At that time, the value in the fine swap region DOF should be decreased (e.g., from 01 to 00) with the same amount of the non-zero AOF in order to prevent excessive correction. In other words, at the time that the latency has elapsed, the fine swap region DOF should be adjusted back such that the sum of the fine correction value and the coarse correction value is substantially equal to the BLW correction value.

According to the BLW correction procedure described above, the analog gain/offset circuit 14 need not be frequently adjusted. In other words, the switching frequency of the analog gain and/or offset circuit 14 may be substantially reduced compared to a conventional BLW correction system. As a result, the consumed power is also considerably cut down. Moreover, the design complexity and chip area of the analog gain/offset circuit 14 are also substantially reduced.

The BLW correction system depicted in FIG. 1 may also include a digital gain circuit 15 that receives the corrected digital output of the adder 13. It is noted that the order of the adder 13 and the digital gain circuit 15 may be exchanged. An equalizer 16 follows the adder 13 or the digital gain circuit 15 to perform equalization on the output of the adder 13 or the digital gain circuit 15. The output of the equalizer 16 is then fed to the slicer 9.

Figure 3A:
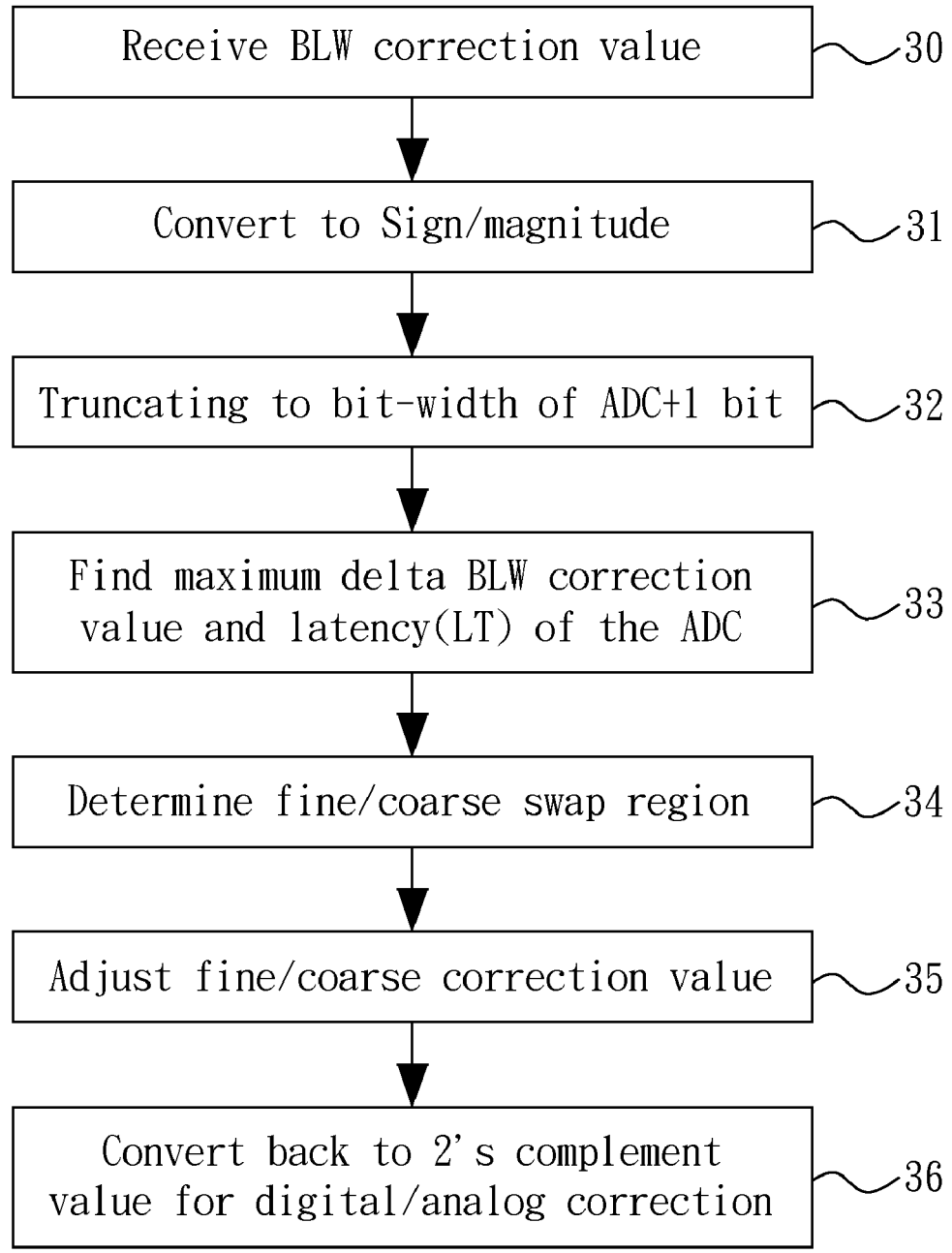
FIG. 3A shows a flow diagram that illustrates a method of generating the fine correction value and the coarse correction value.
Figure 3B:
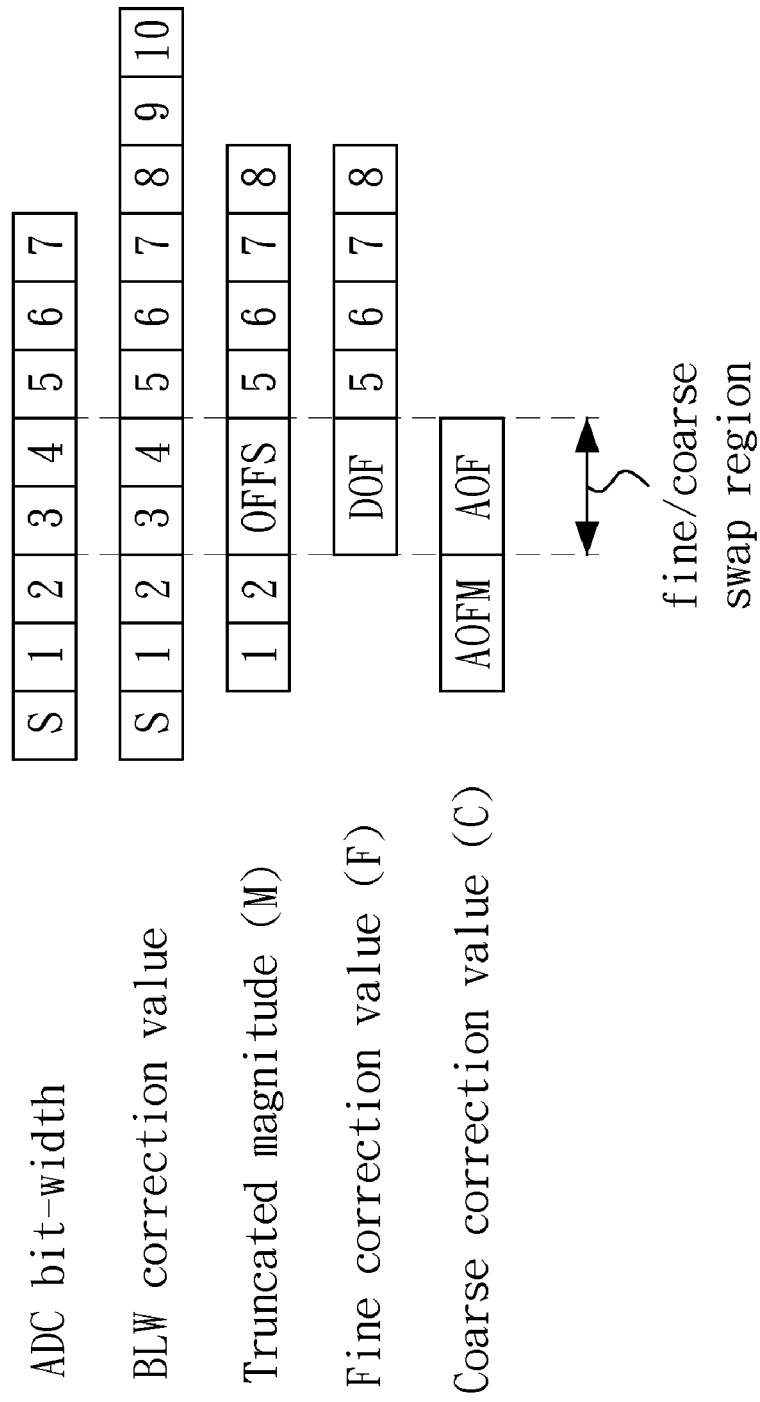
FIG. 3B shows exemplary values according to the flow of FIG. 3A.

FIG. 3A shows a flow diagram that illustrates a method of generating the fine correction value and the coarse correction value, and FIG. 3B shows exemplary values according to the flow of FIG. 3A. Specifically, in step 30, the BLW correction value is received from the BLW correction unit 10. The received BLW correction value is converted to sign/magnitude format (step 31) as exemplified in FIG. 3B. The converted BLW correction value is 11-bit wide with the first one a sign bit S, where numeral "1" represents bit $2^{-1}$, numeral "2" represents bit $2^{-2}$, etc., assumed that the BLW correction system is normalized to the value 1.

Subsequently, in step 32, one or more least significant bits (LSBs) of the converted BLW correction value are truncated such that the bit-width of the truncated magnitude M is one bit wider than the magnitude bit-width of the ADC output. For example, as exemplified in FIG. 3B, the ADC output has seven magnitude bits, and the truncated magnitude of the BLW correction value has eight bits.

In step 33, the maximum changed amount (or maximum delta) of the BLW correction value is obtained. In the example, the maximum delta<$2^{-m}$, where m=7. Assume the latency LT of the ADC 12 is 6, an integer n fitting the inequality $2^n$>LT is obtained to be 3.

Afterwards, in step 34, the fine/coarse swap region DOF/AOF is determined according to a minimum coarse correction step ASTEP that may be obtained as ASTEP=$2^{-m}*2^n$=$2^{-4}$. In the example shown in FIG. 3B, the fine/coarse swap region DOF/AOF is 2-bit wide, that is, $2^{-3}$-$2^{-4}$ (or bits 3-4). Accordingly, the fine correction value is composed of bits 3-8 (i.e., $2^{-3}$-$2^{-8}$), where the fine swap region DOF is composed of bits 3-4 (i.e., $2^{-3}$-$2^{-4}$). The coarse correction value is composed of bits 1-4 (i.e., $2^{-1}$-$2^{-4}$), where the coarse swap region AOF is composed of bits 3-4 (i.e., $2^{-3}$-$2^{-4}$). In FIG. 3B, the bits that are more significant than the coarse swap region AOF are also denoted AOFM, and the swap region in the truncated magnitude M of the BLW correction value is denoted OFFS.

In step 35, the fine correction value and the coarse correction value are adaptively adjusted according to the truncated magnitude M of the BLW correction value, the minimum coarse correction step ASTEP and the latency LT. Step 35 will be detailed in the following paragraphs accompanied with FIG. 4A and FIG. 4B.

Before feeding the adjusted fine/coarse correction values to the adder 13 and the analog gain/offset circuit 14 to perform digital/analog correction respectively, the adjusted fine/coarse correction values are converted back to 2' complement format that is adopted by the ADC 12 (step 36).

Figure 4A:
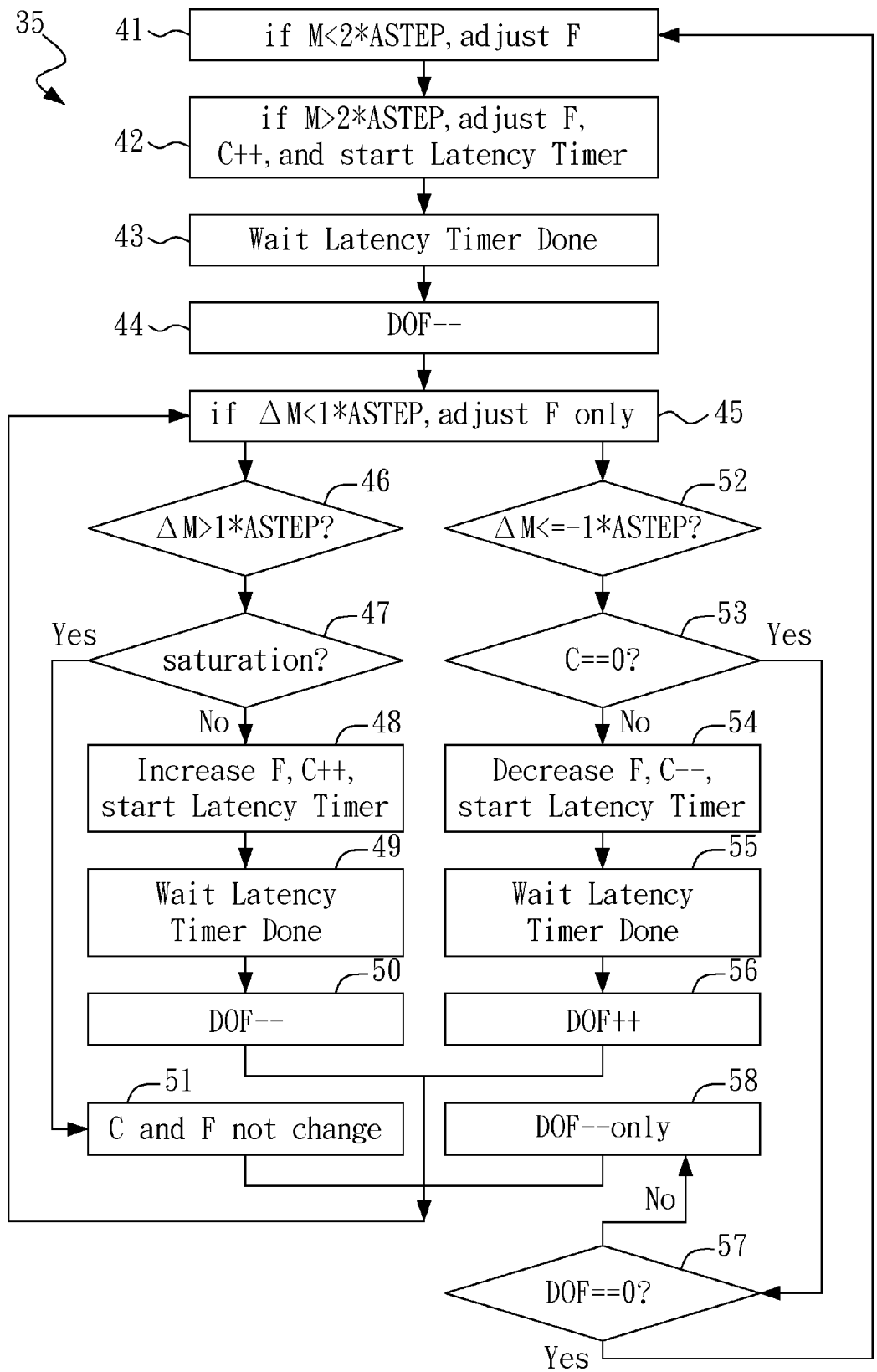
FIG. 4A shows a detailed flow diagram of the step of adjusting the fine/coarse value in FIG. 3A.
Figure 4B:
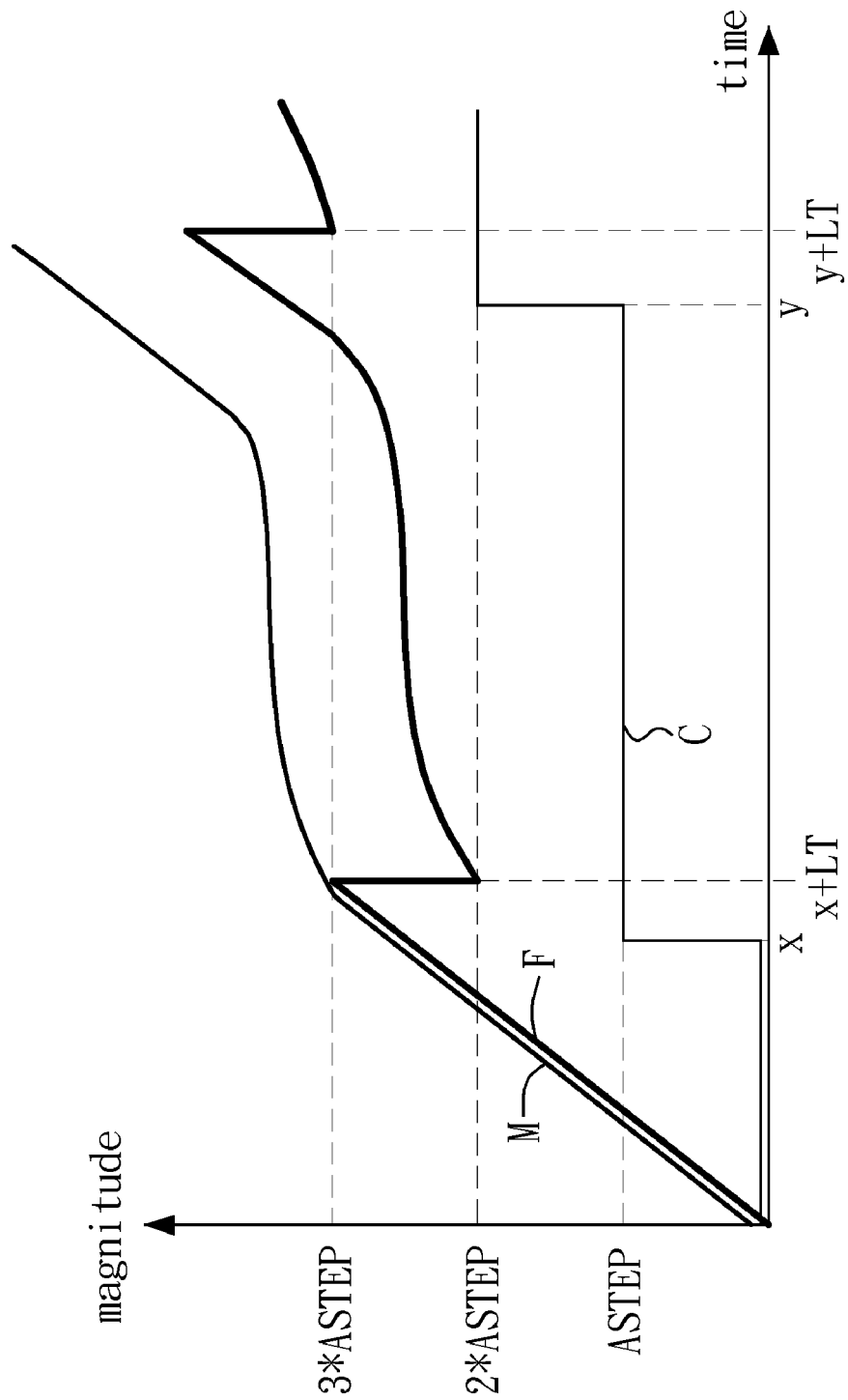
FIG. 4B exemplifies the relationship among the (truncated) magnitude of the BLW correction value, the fine correction value and the coarse correction value.

FIG. 4A shows a detailed flow diagram of the step 35 of FIG. 3A (i.e., the step of adjusting the fine/coarse value), and FIG. 4B exemplifies the relationship among the (truncated) magnitude M of the BLW correction value, the fine correction value F, and the coarse correction value C.

Specifically speaking, in step 41, only the fine correction value F is adjusted if M<2*ASTEP, where M is the truncated magnitude of the BLW correction value and ASTEP is the minimum coarse correction step. As shown in FIG. 4B, the adjusted fine correction value F follows the magnitude M before time x.

When M>=2*ASTEP, in step 42, the fine correction value F is adjusted, the coarse correction value C is incremented and a latency (LT) timer is started. Before the latency timer comes to a stop (e.g., before time x+LT in FIG. 4B), only the fine correction value F has an effect on the BLW correction, while the coarse correction value C does not take effect.

At the time that the latency timer stops (e.g., at time x+LT in FIG. 4B) (step 43), the correction value C takes effect, and therefore the fine swap region DOF should be decremented (step 44) as shown in FIG. 4B. It is observed that the sum of the fine correction value F and the after-latency coarse correction value C is substantially equal to the magnitude M of the BLW correction value, and may be expressed as M(n)=F(n)+C(n−LT), where n denotes the time.

Afterwards, in step 45, if the varied amount of the magnitude ΔM<1*ASTEP, only the fine correction value F is adjusted. If ΔM>=1*ASTEP (step 46) and no saturation exist (i.e., the coarse correction value C does not overflow) (step 47), the fine correction value F is increased, the coarse correction value C is incremented, and the latency timer is started (step 48). At the time that the latency timer stops (step 49), the coarse correction value C takes effect, and therefore the fine swap region DOF should be decremented (step 50). On the other hand, if the coarse correction value C is saturated, the C value and the F value are maintained without change (step 51).

Similarly, in step 52, if the varied amount of the magnitude ΔM<−1*ASTEP and the coarse correction value C is non-zero (step 53), the fine correction value F is decreased, the coarse correction value C is decremented, and the latency timer is started (step 54). At the time that the latency timer stops (step 55), the coarse correction value C takes effect, and therefore the fine swap region DOF should be incremented (step 56).

On the other hand, if the coarse correction value C is zero (step 53) and the fine swap region DOF is non-zero (step 57), only the fine swap region DOF is decremented (step 58). Otherwise, if both the coarse correction value C (step 53) and the fine swap region DOF (step 57) are zero (that is, M<1*ASTEP), the flow returns back to the beginning step 41.

According to the embodiment described above, the fine correction value and the coarse correction value act in concert to correctly and effectively correct the BLW effect. As discussed above, the analog gain/offset circuit 14 need not be frequently adjusted, and its switching frequency may be substantially reduced compared to the conventional BLW correction system. Moreover, the embodiment of the present invention omits bulky delay line or circuit required to compensate for the latency in the pipelined ADC in the conventional BLW correction system.

Although specific embodiments have been illustrated and described, it will be appreciated by those skilled in the art that various modifications may be made without departing from the scope of the present invention, which is intended to be limited solely by the appended claims.

What is claimed is:

1. A system of correcting baseline wander (BLW), comprising:
   an analog-to-digital converter (ADC) configured to convert an analog input to a digital output;

a slicer configured to map the digital output to one of a plurality of predefined values;

a BLW correction unit configured to generate a BLW correction value according to a difference between an input to the slicer and an output of the slicer; and a correction controller configured to generate a fine correction value and a coarse correction value according to the BLW correction value;

wherein the fine correction value is used to correct the digital output of the ADC, and the coarse correction value is used to correct the analog input of the ADC.

2. The system of claim 1, wherein the fine correction value is composed of a plurality of least significant bits (LSBs) of the BLW correction value; the coarse correction value is composed of a plurality of most significant bits (MSBs) of the BLW correction value; and a swap region is bit-wide overlapped between the fine correction value and the coarse correction value, thereby resulting in a fine swap region in the fine correction value and a coarse swap region in the coarse correction value.

3. The system of claim 2, wherein the fine swap region is adjusted when a latency of the ADC has elapsed such that a sum of the fine correction value and the coarse correction value is equal to the BLW correction value at a time that the latency has elapsed.

4. The system of claim 1, further comprising an adder configured to add the digital output of the ADC and the fine correction value.

5. The system of claim 1, further comprising an analog gain/offset circuit disposed before the ADC and configured to adjust gain or offset of the analog input according to the coarse correction value.

6. The system of claim 4, further comprising a digital gain circuit disposed after the adder.

7. The system of claim 6, further comprising an equalizer disposed after the digital gain circuit and before the slicer.

8. A method of correcting baseline wander (BLW), comprising:

performing analog-to-digital conversion (ADC) to convert an analog input to a digital output;

receiving a BLW correction value; and generating a fine correction value and a coarse correction value according to the BLW correction value;

wherein the fine correction value is used to correct the digital output, and the coarse correction value is used to correct the analog input; and wherein the BLM correction value is generated according to a difference between an input to a slicer and an output of the slicer.

9. The method of claim 8, wherein the fine correction value is composed of a plurality of least significant bits (LSBs) of the BLW correction value; the coarse correction value is composed of a plurality of most significant bits (MSBs) of the BLM correction value; and a swap region is bit-wide overlapped between the fine correction value and the coarse correction value, thereby resulting in a fine swap region in the fine correction value and a coarse swap region in the coarse correction value.

10. The method. of claim 9, wherein the fine swap region is adjusted when a latency of the ADC has elapsed such that a sum of the fine correction value and the coarse correction value is equal to the BLM correction value at a time that the latency has elapsed.

11. The method of claim 8, further comprising a step of adding the digital output of the ADC and the fine correction value.

12. The method of claim 8, further comprising a step of adjusting gain, or offset of the analog input according to the coarse correction value.

13. The method of claim 11, further comprising a step of adjusting gain, of an added sum of the digital output and the fine correction value.

14. The method of claim 8, wherein the step of generating the fine correction value and the coarse correction value comprises:

converting the BLW correction value to a sign/magnitude format;

one or more least significant bits (LSBs) of the converted BLM correction value are truncated such that the bit-width of the truncated magnitude is one bit wider than a magnitude bit-width of the ADC digital output;

obtaining a maximum changed. amount of the BLW correction value;

determining the fine/coarse swap region according to a minimum, coarse correction step; and adaptively adjusting the fine correction value and the coarse correction value according to the truncated magnitude of the BLW correction value, the minimum coarse correction step and a latency of the ADC.

15. The method of claim 14, further comprising a step of converting the adjusted fine/coarse correction values back to 2' complement format.

* * * * *